US010494718B2

(12) United States Patent
Kilpi et al.

(10) Patent No.: US 10,494,718 B2
(45) Date of Patent: Dec. 3, 2019

(54) DEPOSITION REACTOR WITH PLASMA SOURCE

(75) Inventors: Vaino Kilpi, Espoo (FI); Wei-Min Li, Espoo (FI); Timo Malinen, Espoo (FI); Juhana Kostamo, Espoo (FI); Sven Lindfors, Espoo (FI)

(73) Assignee: PICOSUN OY, Espoo (FI)

( * ) Notice: Subject to any disclaimer, the term of this patent is extended or adjusted under 35 U.S.C. 154(b) by 870 days.

(21) Appl. No.: 14/110,149

(22) PCT Filed: Apr. 7, 2011

(86) PCT No.: PCT/FI2011/050302
§ 371 (c)(1),
(2), (4) Date: Nov. 20, 2013

(87) PCT Pub. No.: WO2012/136875
PCT Pub. Date: Oct. 11, 2012

(65) Prior Publication Data
US 2014/0087093 A1    Mar. 27, 2014

(51) Int. Cl.
*C23C 16/455* (2006.01)
*C23C 16/40* (2006.01)
(Continued)

(52) U.S. Cl.
CPC ...... *C23C 16/45589* (2013.01); *C23C 16/403* (2013.01); *C23C 16/458* (2013.01);
(Continued)

(58) Field of Classification Search
CPC ............ C23C 16/403; C23C 16/45536; C23C 16/45538; C23C 16/45544;
(Continued)

(56) References Cited

U.S. PATENT DOCUMENTS 2,880,902 A * 4/1959 Owsen ............... A45F 3/20
                                                    200/85 R
3,138,483 A * 6/1964 Dettling ............... B05D 7/22
                                                    118/408
(Continued)

FOREIGN PATENT DOCUMENTS

CN    101052745 A    10/2007
JP    03-036274 A    2/1991
(Continued)

OTHER PUBLICATIONS

Notice of Ground of Rejection received for Japanese Patent Application No. JP 2014-503180, dated Jan. 29, 2015, 11 pages including 6 pages of English Translation.
(Continued)

*Primary Examiner* — Benjamin Kendall
(74) *Attorney, Agent, or Firm* — Ziegler IP Law Group, LLC

(57) ABSTRACT

A deposition reactor includes an in-feed part that defines an expansion space which leads reactants as a top to bottom flow from a plasma source towards a reaction chamber, the expansion space widening towards the reaction chamber, and a lifting mechanism for loading at least one substrate to the reaction chamber from the top side of the reaction chamber. The deposition reactor deposits material on the at least one substrate in the reaction chamber by sequential self-saturating surface reactions.

15 Claims, 16 Drawing Sheets

(51) Int. Cl.
  *C23C 16/458* (2006.01)
  *C23C 16/50* (2006.01)
  *H01J 37/32* (2006.01)

(52) U.S. Cl.
  CPC .. *C23C 16/45536* (2013.01); *C23C 16/45544* (2013.01); *C23C 16/45582* (2013.01); *C23C 16/50* (2013.01); *H01J 37/32357* (2013.01); *H01J 37/32449* (2013.01)

(58) Field of Classification Search
  CPC ........ C23C 16/45546; C23C 16/45561; C23C 16/45582; C23C 16/45589; C23C 16/458; C23C 16/50; C30B 25/16–165; H01J 37/32357; H01J 37/3244–32449; H01L 21/67303–67309; H01L 21/67346; H01L 21/67748; H01L 21/67754
  See application file for complete search history.

(56) References Cited

U.S. PATENT DOCUMENTS

| | | | | |
|---|---|---|---|---|
| 4,889,580 | A | * | 12/1989 | Seki ...................... B31F 1/2881 156/210 |
| 5,088,444 | A | * | 2/1992 | Ohmine ............ H01L 21/67748 118/715 |
| 5,458,685 | A | * | 10/1995 | Hasebe ................ C23C 16/4401 118/715 |
| 6,149,728 | A | | 11/2000 | Park et al. |
| 2005/0019494 | A1 | | 1/2005 | Moghadam et al. |
| 2005/0271812 | A1 | | 12/2005 | Myo et al. |
| 2006/0151114 | A1 | * | 7/2006 | Fink .................... H01J 37/3244 156/345.29 |
| 2006/0196418 | A1 | * | 9/2006 | Lindfors ........... C23C 16/45525 118/715 |
| 2009/0263578 | A1 | * | 10/2009 | Lindfors ............. C23C 16/4485 427/248.1 |
| 2010/0028122 | A1 | | 2/2010 | Lindfors et al. |
| 2010/0183825 | A1 | * | 7/2010 | Becker ................ C23C 16/4404 427/569 |

FOREIGN PATENT DOCUMENTS

| | | |
|---|---|---|
| JP | 08-045907 A | 2/1996 |
| JP | 10-150029 A | 6/1998 |
| JP | 2004-296490 A | 10/2004 |
| KR | 20110008089 A | 1/2011 |
| WO | 2005/113852 A2 | 12/2005 |
| WO | 2012/136875 A1 | 10/2012 |

OTHER PUBLICATIONS

First Office Action received for Chinese Patent Application No. CN 201180069841.2, dated Jan. 15, 2015, 19 pages including 12 pages of English translation.
International Preliminary Report on Patentability and Written Opinion received for International Patent Application No. PCT/FI2011/050302, dated Oct. 17, 2013, 8 pages.
Korean Intellectual Property Office, Notice of Non-Final Rejection, Application No. 10-2013-7027394, dated Apr. 10, 2017, 5 pages.

* cited by examiner

DEPOSITION REACTOR WITH PLASMA SOURCE

CROSS-REFERENCE TO RELATED APPLICATIONS

This application is the US National Stage of International Application No. PCT/FI2011/050302, filed on 7 Apr. 2011, which designated the United States of America and which was published under PCT Article (2) as Publication No. WO2012/136875, the disclosure of which is incorporated herein by reference in its entirety.

BACKGROUND

1. Field

The aspects of the disclosed embodiments generally relate to deposition reactors with a plasma source. More particularly, but not exclusively, the aspects of the disclosed embodiments relate to such deposition reactors in which material is deposited on surfaces by sequential self-saturating surface reactions.

2. Brief Description of Related Developments

Atomic Layer Epitaxy (ALE) method was invented by Dr. Tuomo Suntola in the early 1970's. Another generic name for the method is Atomic Layer Deposition (ALD) and it is nowadays used instead of ALE. ALD is a special chemical deposition method based on the sequential introduction of at least two reactive precursor species to a substrate. The substrate is located within a reaction space. The reaction space is typically heated. The basic growth mechanism of ALD relies on the bond strength differences between chemical adsorption (chemisorption) and physical adsorption (physisorption). ALD utilizes chemisorption and eliminates physisorption during the deposition process. During chemisorption a strong chemical bond is formed between atom(s) of a solid phase surface and a molecule that is arriving from the gas phase. Bonding by physisorption is much weaker because only van der Waals forces are involved. Physisorption bonds are easily broken by thermal energy when the local temperature is above the condensation temperature of the molecules.

The reaction space of an ALD reactor comprises all the heated surfaces that can be exposed alternately and sequentially to each of the ALD precursor used for the deposition of thin films. A basic ALD deposition cycle consists of four sequential steps: pulse A, purge A, pulse B and purge B. Pulse A typically consists of metal precursor vapor and pulse B of non-metal precursor vapor, especially nitrogen or oxygen precursor vapor. Inactive gas, such as nitrogen or argon, and a vacuum pump are used for purging gaseous reaction by-products and the residual reactant molecules from the reaction space during purge A and purge B. A deposition sequence comprises at least one deposition cycle. Deposition cycles are repeated until the deposition sequence has produced a thin film of desired thickness.

Precursor species form through chemisorption a chemical bond to reactive sites of the heated surfaces. Conditions are typically arranged in such a way that no more than a molecular monolayer of a solid material forms on the surfaces during one precursor pulse. The growth process is thus self-terminating or saturative. For example, the first precursor can include ligands that remain attached to the adsorbed species and saturate the surface, which prevents further chemisorption. Reaction space temperature is maintained above condensation temperatures and below thermal decomposition temperatures of the utilized precursors such that the precursor molecule species chemisorb on the substrate(s) essentially intact. Essentially intact means that volatile ligands may come off the precursor molecule when the precursor molecules species chemisorb on the surface. The surface becomes essentially saturated with the first type of reactive sites, i.e. adsorbed species of the first precursor molecules. This chemisorption step is typically followed by a first purge step (purge A) wherein the excess first precursor and possible reaction by-products are removed from the reaction space. Second precursor vapor is then introduced into the reaction space. Second precursor molecules typically react with the adsorbed species of the first precursor molecules, thereby forming the desired thin film material. This growth terminates once the entire amount of the adsorbed first precursor has been consumed and the surface has essentially been saturated with the second type of reactive sites. The excess of second precursor vapor and possible reaction by-product vapors are then removed by a second purge step (purge B). The cycle is then repeated until the film has grown to a desired thickness. Deposition cycles can also be more complex. For example, the cycles can include three or more reactant vapor pulses separated by purging steps. All these deposition cycles form a timed deposition sequence that is controlled by a logic unit or a microprocessor.

Thin films grown by ALD are dense, pinhole free and have uniform thickness. For example, aluminum oxide grown by thermal ALD from trimethylaluminum $(CH_3)_3Al$, also referred to as TMA, and water at 250-300° C. has usually about 1% non-uniformity over the 100-200 mm diameter wafer. Metal oxide thin films grown by ALD are suitable for gate dielectrics, electroluminescent display insulators, fill layers for magnetic read head gaps, capacitor dielectrics and passivation layers. Metal nitride thin films grown by ALD are suitable for diffusion barriers, e.g., in dual damascene structures.

Precursors suitable for ALD processes in various ALD reactors are disclosed, for example, in review article R. Puurunen, "*Surface chemistry of atomic layer deposition: A case study for the trimethylaluminium/water process*", *J. Appl. Phys.*, 97 (2005), p. 121301, which is incorporated herein by reference.

The use of radicals in ALD processes may achieve some advantages, such as the possibility to use thermally sensitive substrates at very low deposition temperatures. In a plasma ALD reactor, radicals are generated by a plasma source. The use of a plasma source, however, may cause certain requirements or specific problems for the deposition reactor.

SUMMARY

According to a first example aspect of the disclosed embodiments there is provided a deposition reactor comprising:

an in-feed part that defines an expansion space which is configured to lead reactants as a top to bottom flow from a plasma source towards a reaction chamber, the expansion space widening towards the reaction chamber; and a lifting mechanism for loading at least one substrate to the reaction chamber from the top side of the reaction chamber, and the deposition reactor being configured to deposit material on said at least one substrate in the reaction chamber by sequential self-saturating surface reactions.

In certain embodiments, the deposition reactor is a plasma enhanced atomic layer deposition reactor, a PEALD reactor. In certain embodiments, the deposition reactor comprises the plasma source on the top side of the reactor chamber. In certain embodiments, the plasma source is an inductively coupled plasma source. In certain embodiments, the plasma source is configured to produce radicals used as reactants in the deposition reactor.

In certain embodiments, the lifting mechanism enables loading from the top side of the reaction chamber.

In certain embodiments, said in-feed part defining or forming the expansion space is variable in its dimensions or its shape or size. In certain embodiments, said lifting mechanism is configured to change the dimensions of said in-feed part.

In certain embodiments, said in-feed part has a contracted shape and an extended shape, and said lifting mechanism is configured to push or pull said in-feed part from said extended shape to said contracted shape allowing said loading of said at least one substrate when said in-feed part is in its contracted shape.

In certain embodiments, said in-feed part is configured to deform vertically.

In certain embodiments, said in-feed part comprises a set of nested sub-parts or ring-like members movable to fit within each other. The sub-parts may be hollow from inside. The number of nested sub-parts may be two or more to form a telescopic structure. The form of the nested sub-parts may be a truncated cone. In an embodiment, where said in-feed part practically consists of two or more sub-parts, at least the sub-part that is closest to the reaction space may be a truncated cone. In certain embodiments, said in-feed part consists of two nested sub-parts.

In certain embodiments, said lifting mechanism comprises a lift. It may comprise for example a linear feedthrough.

In certain embodiments, said in-feed part is attached to an expansion space flange which in turn is fitted against a top flange of the reaction chamber during deposition. Thereby, a surface against a surface seal may be provided.

In certain embodiments, said lifting mechanism is configured to move a substrate holder carrying said at least one substrate between an upper position for loading or unloading and a lower position for deposition.

In certain embodiments, the deposition reactor comprises a substrate transfer chamber between the plasma source and said reaction chamber. The substrate transfer chamber may comprise an interface for a load lock.

In certain embodiments, the deposition reactor comprises a manual access hatch in said in-feed part.

In certain embodiments, the deposition reactor comprises said lifting mechanism comprising a plurality of symmetrically placed elevators. In certain embodiments, the number of elevators is two. In certain other embodiments, the number of elevators is three, four or more. The elevators may be symmetrical with respect to the in-feed part.

In certain embodiments, the deposition reactor is configured to use a substrate holder carrying said at least one substrate as a primary obstacle for the gas flow in the reaction space.

In certain embodiments, the deposition reactor comprises or is provided with a flow adjustment part. The flow adjustment part is placed between the substrate holder and reaction chamber wall. It may surround the substrate holder. In certain embodiments, it may substantially fill in the space between the substrate holder and the reaction chamber wall. In certain embodiments, the flow adjustment part may be a ring with holes in it. The holes may be uniform in size, or they may be variable in size in order to pass more flow in the larger holes.

In certain embodiments, the in-feed part is deformable, and the apparatus comprises at least one mechanical actuator to deform the in-feed part between a contracted shape and an extended shape.

In certain embodiments, a substrate holder carrying at least one substrate is mechanically coupled to the deformable in-feed part, and wherein deforming said deformable in-feed part causes said substrate holder carrying at least one substrate to lift into an upper position for loading or unloading.

According to a second example aspect of the disclosed embodiments there is provided a method comprising: operating the deposition reactor according to any of the presented embodiments.

In certain embodiments, the method comprises using a deformable in-feed part which is deformable between a contracted shape and an extended shape by at least one mechanical actuator.

In certain embodiments, a substrate holder carrying at least one substrate is mechanically coupled to the deformable in-feed part, and the method comprises:

causing by deforming said deformable in-feed part said substrate holder carrying at least one substrate to lift into an upper position for loading or unloading.

Different non-binding example aspects and embodiments have been illustrated in the foregoing. The above embodiments are used merely to explain selected aspects or steps that may be utilized in implementations of the present invention. Some embodiments may be presented only with reference to certain example aspects of the invention. It should be appreciated that corresponding embodiments may apply to other example aspects as well. Any appropriate combinations of the embodiments may be formed.

BRIEF DESCRIPTION OF THE DRAWINGS

The aspects of the disclosed embodiments will now be described, by way of example only, with reference to the accompanying drawings, in which.

DETAILED DESCRIPTION

In the following description, Atomic Layer Deposition (ALD) technology is used as an example. The purpose, however, is not to strictly limit to that technology but it has to be recognized that certain embodiments may be applicable also in methods and apparatus utilizing other comparable atomic-scale deposition technologies.

The basics of an ALD growth mechanism are known to a skilled person. Details of ALD methods have also been described in the introductory portion of this patent application. These details are not repeated here but a reference is made to the introductory portion with that respect.

Figure 1:
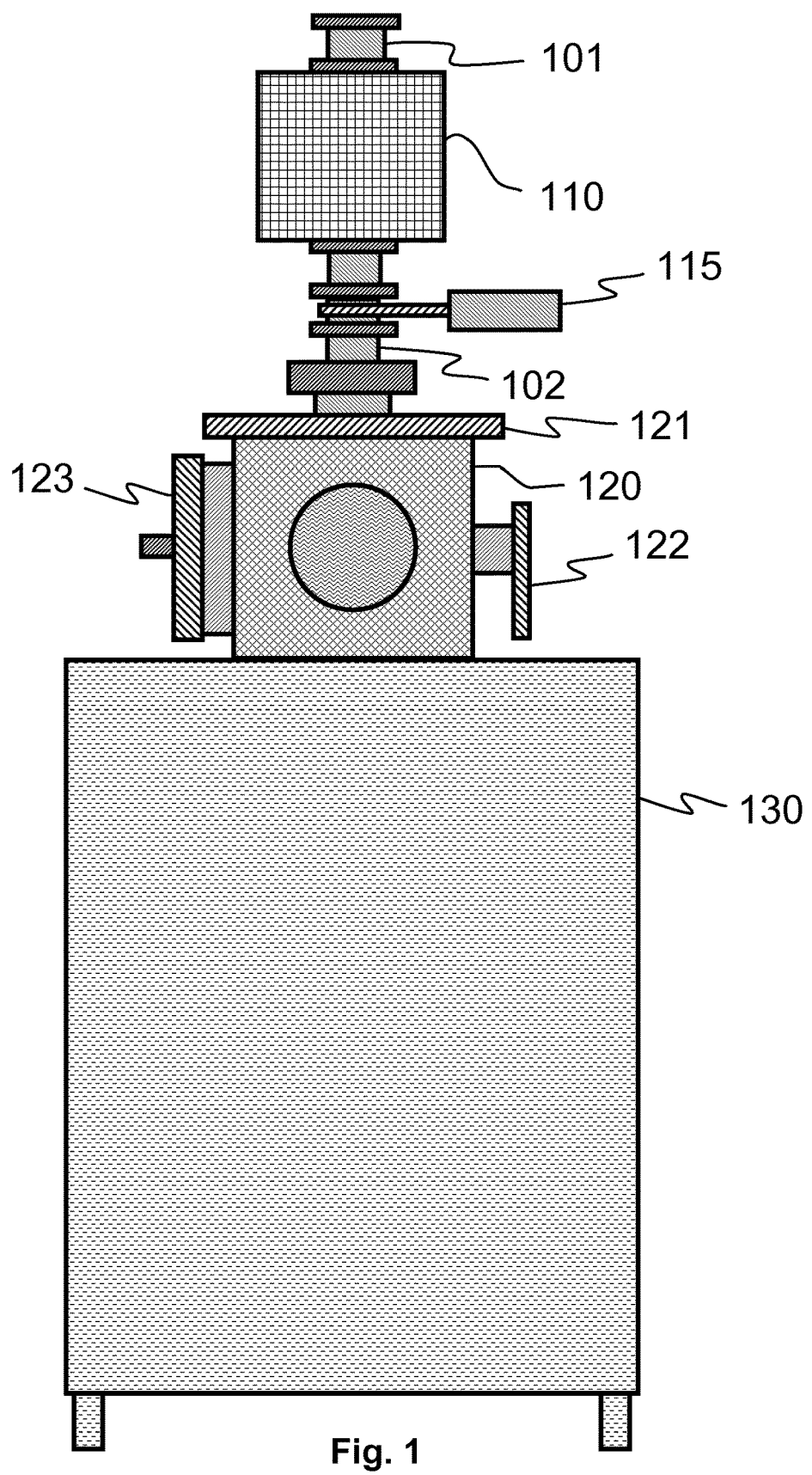
FIG. 1 shows a deposition reactor in accordance with an example embodiment.

FIG. 1 shows a deposition reactor (a plasma ALD reactor or similar) in a side view. The deposition reactor comprises a reaction chamber (not shown in FIG. 1) below a substrate transfer chamber 120 inside an ALD reactor module 130. Source gas flows via a source gas line 101 into a plasma source 110 on the top side of the reaction chamber. Radicals generated by the plasma source 110 from the source gas flow via line 102 towards the reaction chamber. In between the plasma source 110 and the reaction chamber there is the substrate transfer chamber 120. At least one substrate is loaded into the reaction chamber via the substrate transfer chamber 120. The substrate transfer chamber 120 comprises an interface for a load lock or similar for loading said at least one substrate. In an example embodiment, the interface may be a load lock flange 122, or similar, to which a load lock having a gate valve can be attached. In an example embodiment, loading of the at least one substrate into the transfer chamber may be an automated procedure. Alternatively, the at least one substrate may be loaded manually. A larger hatch 123 integrated to the transfer chamber is particularly suitable for manual loading and unloading.

The in-feed line 102 from the plasma source may be closed prior to the transfer chamber 120 by a closing member or valve 115, such as a gate valve or similar, attached to the line 102. In an embodiment, the closing member or valve 115 may be omitted from the construction and there is a protective inert gas (such as argon) flow from the source gas line 101 through the plasma generator 110 towards the reaction space (331, FIG. 3) during the deposition process. When the valve 115 is open, radicals generated by the plasma source 110 from the source gas flow via the in-feed line 102 towards the reaction chamber. The radicals flow through the transfer chamber upper flange 121 into an expansion space (not shown in FIG. 1) that widens towards the reaction chamber. This is shown in more detail in FIG. 2.

The expansion space is defined or formed by an in-feed part or an assembly comprising a set of nested sub-parts or ring-like members 241-245 which are movable to fit within each other. The sub-parts 241-245 thus form a telescopic structure. In the example embodiment shown in FIG. 2 the uppermost sub-part 241 is attached to the transfer chamber upper flange 121. The flange 121 may also be denoted as a vacuum chamber flange, since a vacuum or almost a vacuum can typically be generated into the portion of the transfer chamber that surrounds the in-feed part. In the example embodiment shown in FIG. 2 the lowermost sub-part 245 is attached to an expansion space flange 224 which, during deposition, is substantially leak-tightly fitted against a reaction chamber flange 234 preventing gas leaks between the reaction space (331, FIG. 3) and the gas space surrounding the reaction chamber (335, FIG. 3).

Figure 2:
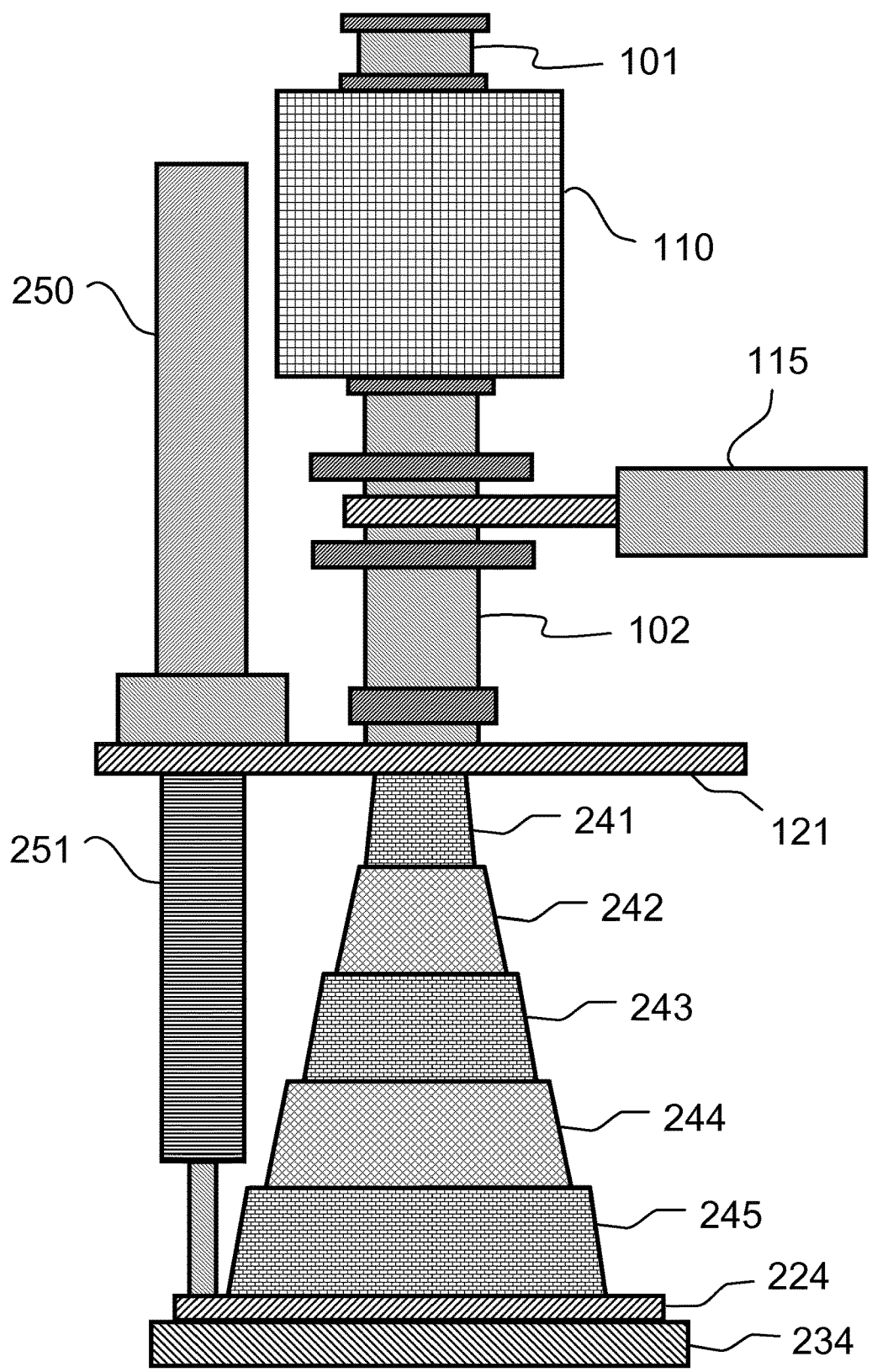
FIG. 2 shows an example embodiment having an expansion space widening towards a reaction chamber.

In the embodiment shown in FIG. 2, a retractable shaft of an elevator 250 is attached to the expansion space flange 224, or directly to the in-feed part. The body of the elevator 250 may also be attached to the transfer chamber upper flange 121 or to another suitable counterpart in the deposition reactor. The elevator 250 may be for example an elevator which operates by means of a retractable shaft at least partially covered with bellows 251 or similar. In an embodiment, this arrangement forms a leak-tight vertically flexible cover between a pneumatic or a linear actuator and the expansion space flange 224 or the in-feed part. In an embodiment, a linear feedthrough for moving the in-feed part and expansion space flange together with the substrate holder in vacuum and controlled from atmosphere side is used.

In an embodiment, the bottom end of the elevator bellows 251 is leak-tightly coupled up with the shaft. Pulling the shaft within the elevator bellows 251 with the actuator contracts the elevator bellows 251, and the at least one substrate 360 or the substrate holder 361 can be pulled up for loading or unloading while keeping the substrate handling area and its surroundings in vacuum.

In an alternative embodiment, the expansion space flange 224 is not separate from the in-feed part but forms part of the in-feed part thus forming a bottom part of the in-feed part. The bottom part in that embodiment functions as a rim seal against the reaction chamber. On the other hand, it functions as a fixing point for the elevator 250 (elevator shaft).

Figure 3:
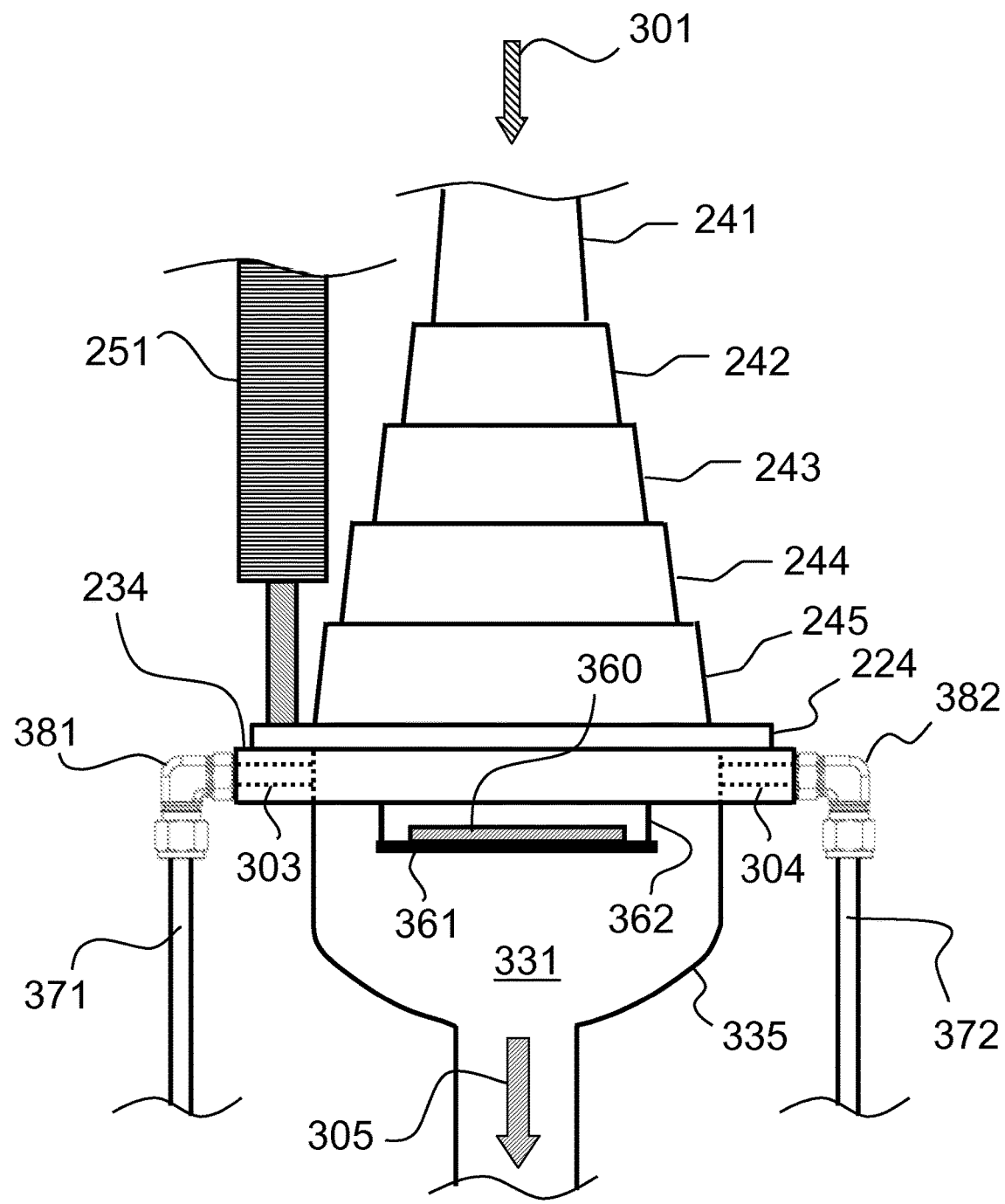
FIG. 3 shows an example embodiment with an elevator pulling a substrate holder up for loading.
Figure 4:
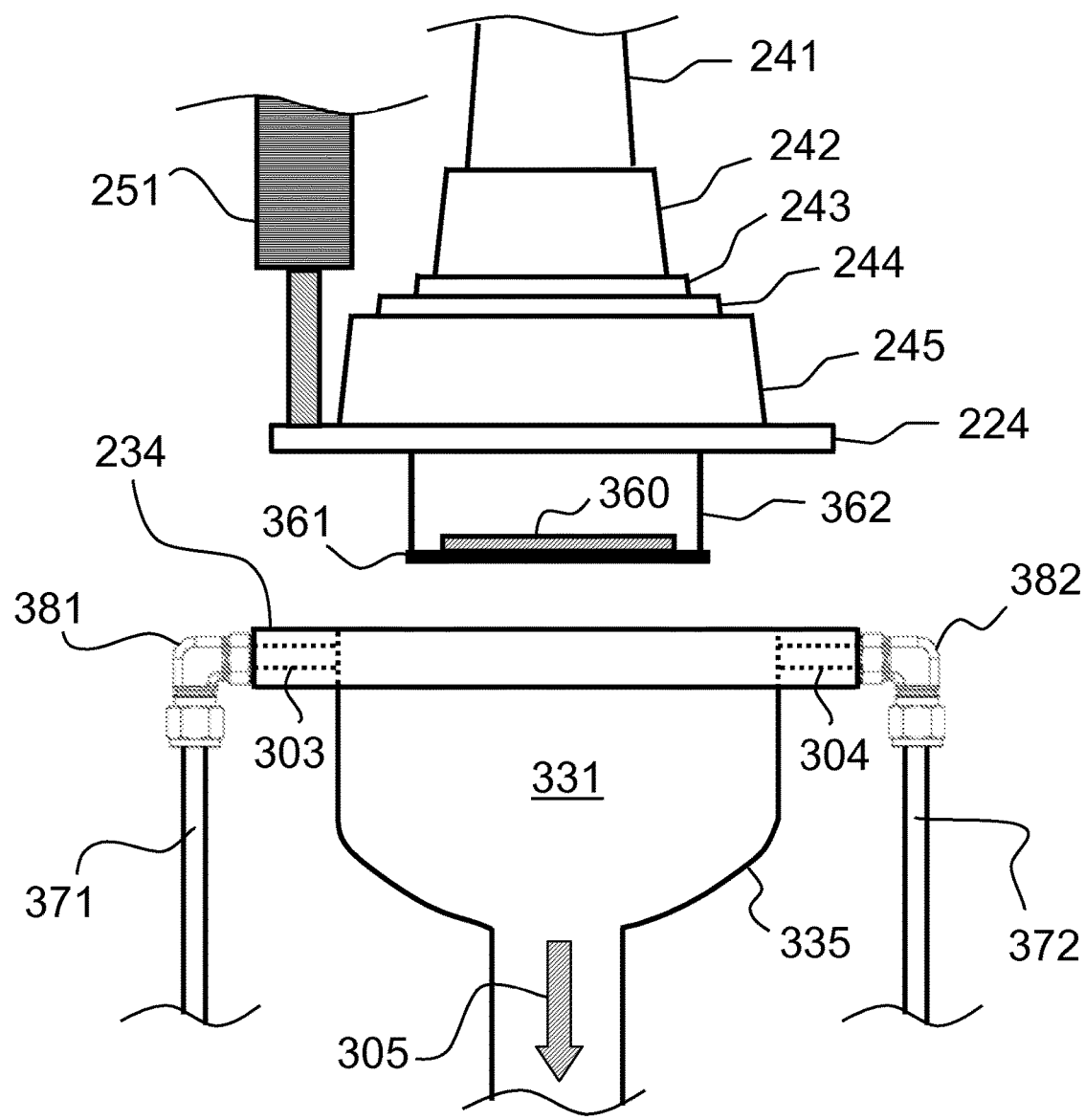
FIG. 4 shows the substrate in the embodiment of FIG. 3 in a raised position.

The in-feed part has an extended shape as shown in FIG. 3 and a contracted shape as shown in FIG. 4. The at least one horizontally placed substrate 360 can be loaded and unloaded via the transfer chamber 120 (FIG. 1) when the in-feed part, which defines the expansion space, is in its contracted shape (FIG. 4). Deposition of material on the at least one substrate 360 by sequential self-saturating surface reactions in the reaction space 331 of the reaction chamber 335, in turn, occurs when the in-feed part is in its extended shape (FIG. 3). Transitions between the extended shape and the contracted shape can be carried out by the elevator 250 (FIG. 2) or similar. In the embodiments shown in FIGS. 2-4, when the elevator bellows 251 is expanded the part that defines the expansion space is in its extended shape (FIG. 3). And, when the elevator bellows 251 is contracted the part that defines the expansion space is in its contracted shape (FIG. 4).

In the embodiment shown in FIG. 3, the at least one substrate 360 is supported by or lies on a substrate holder 361. In an embodiment, the substrate holder comprises two separate sections with an open gap wide enough for freely moving a substrate fork between the sections. The substrate holder 361 is attached to the expansion space flange 224 by holder supports 362. Alternately, radicals from the plasma source 110 (FIGS. 1 and 2) and precursor vapor flow to the reaction space 331 of the reaction chamber 335. Radicals from the plasma source 110 flow as a top to bottom flow 301 via the expansion space to the reaction space 331, and precursor vapor flow either via in-feed line 371 via an example tube fitting 381 and channel 303 within the reaction chamber flange 234 or via in-feed line 372 an example tube fitting 382 and channel 304 within the reaction chamber flange 234. Exhaust gases are removed via an exhaust guide on the bottom as indicated with the flow direction arrow 305.

In an example embodiment, the substrate holder is configured to move together with the expansion space flange 224 or together with the in-feed part. In that way the at least one substrate 360 or the substrate holder 361 can be pulled up for loading or unloading. In an embodiment, the substrate holder 361 is detachably attachable to the expansion space flange 224. In that way the substrate holder 361 together with the at least one substrate 360 can be loaded or unloaded when in upper position (FIG. 4). Similarly, a batch of substrates vertically placed in a substrate holder can be loaded into and unloaded from the deposition reactor as more closely described in the following description with reference to FIG. 15.

Figure 5:
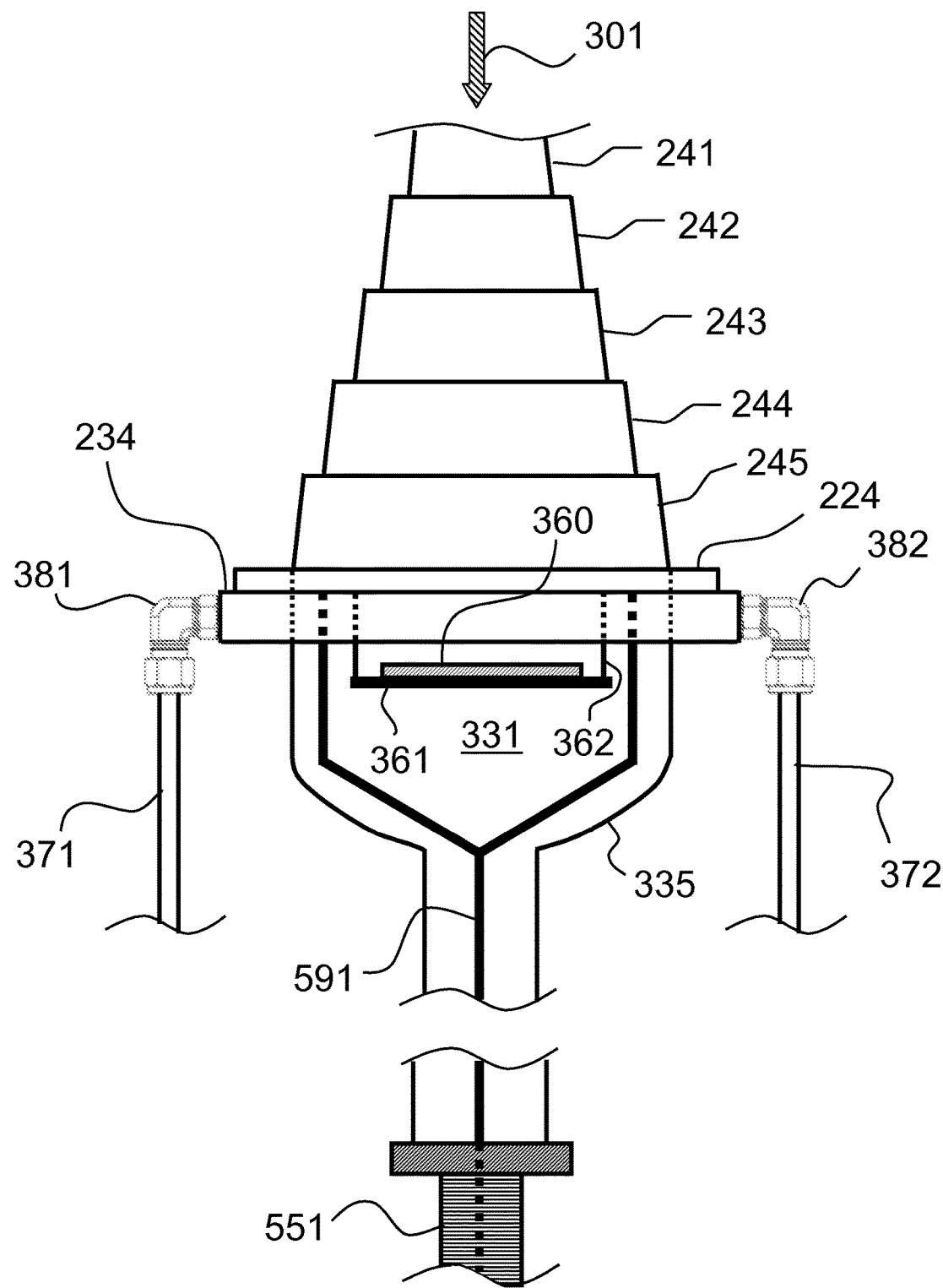
FIG. 5 shows an example embodiment with an elevator pushing a substrate holder up for loading.
Figure 6:
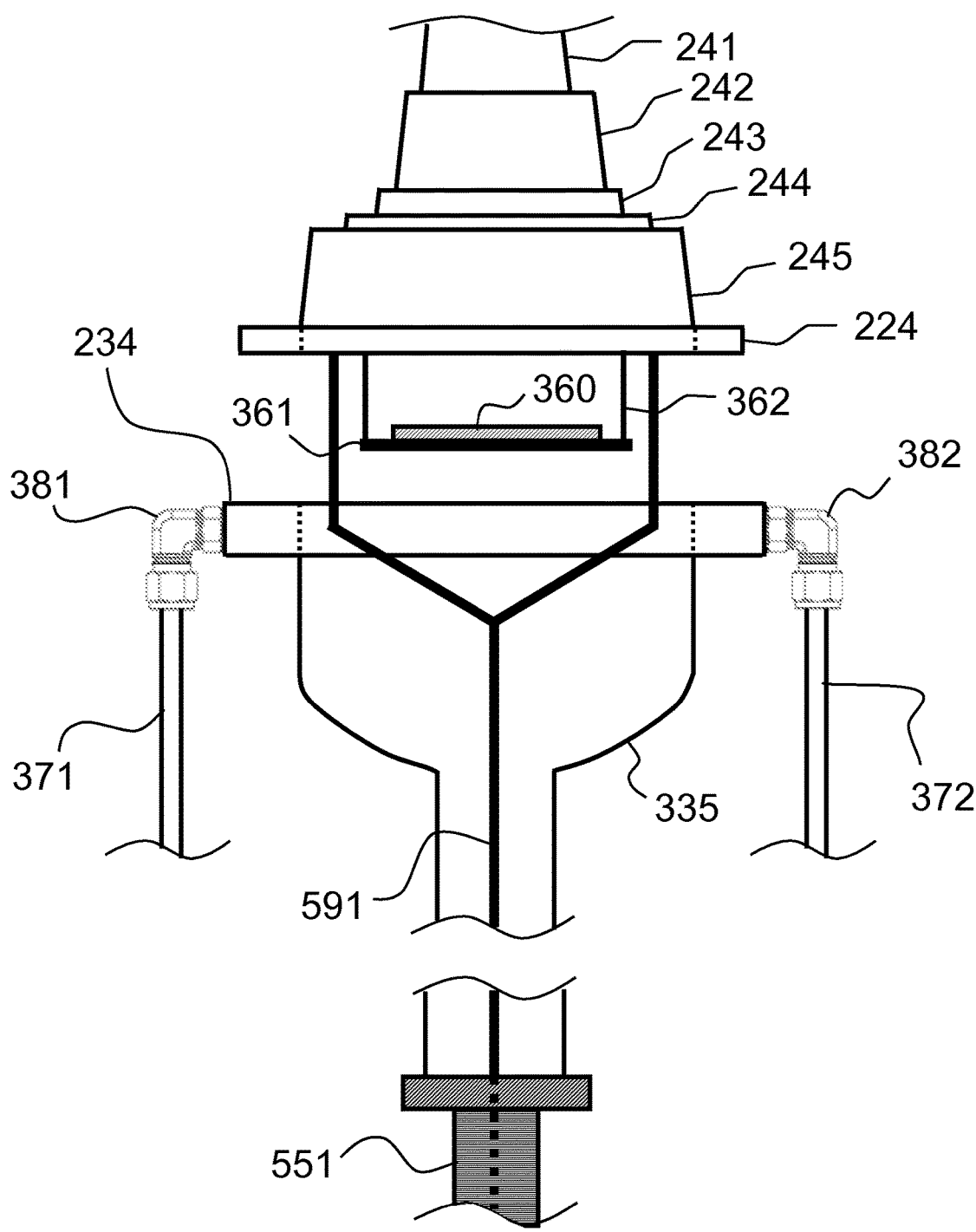
FIG. 6 shows the substrate in the embodiment of FIG. 5 in a raised position.

The example embodiment shown in FIGS. 5 and 6 otherwise corresponds to the embodiments shown in FIGS. 2-4 but instead of using an elevator that pulls the in-feed part from the extended shape to the contracted shape for loading or unloading, an elevator that pushes the part from the extended shape to the contracted shape is used.

The elevator shown in FIGS. 5 and 6 comprises a lifting frame 591 operated by the elevator. The elevator may be for example an elevator which operates by means of a pneumatic actuator or a linear actuator with a stepper motor and a lead screw and a linear feedthrough 551 or similar. In an embodiment, the elevator comprises a flexible part, for example an edge welded bellow connector, for keeping the vacuum space isolated from room air. The lifting frame 591 is attached to the expansion space flange 224, or directly to the in-feed part.

In the embodiments shown in FIGS. 5 and 6, when the linear feedthrough 551 is contracted the in-feed part is in its extended shape (FIG. 5). And, when the linear feedthrough 551 is expanded the in-feed part is in its contracted shape (FIG. 6).

Figure 7:
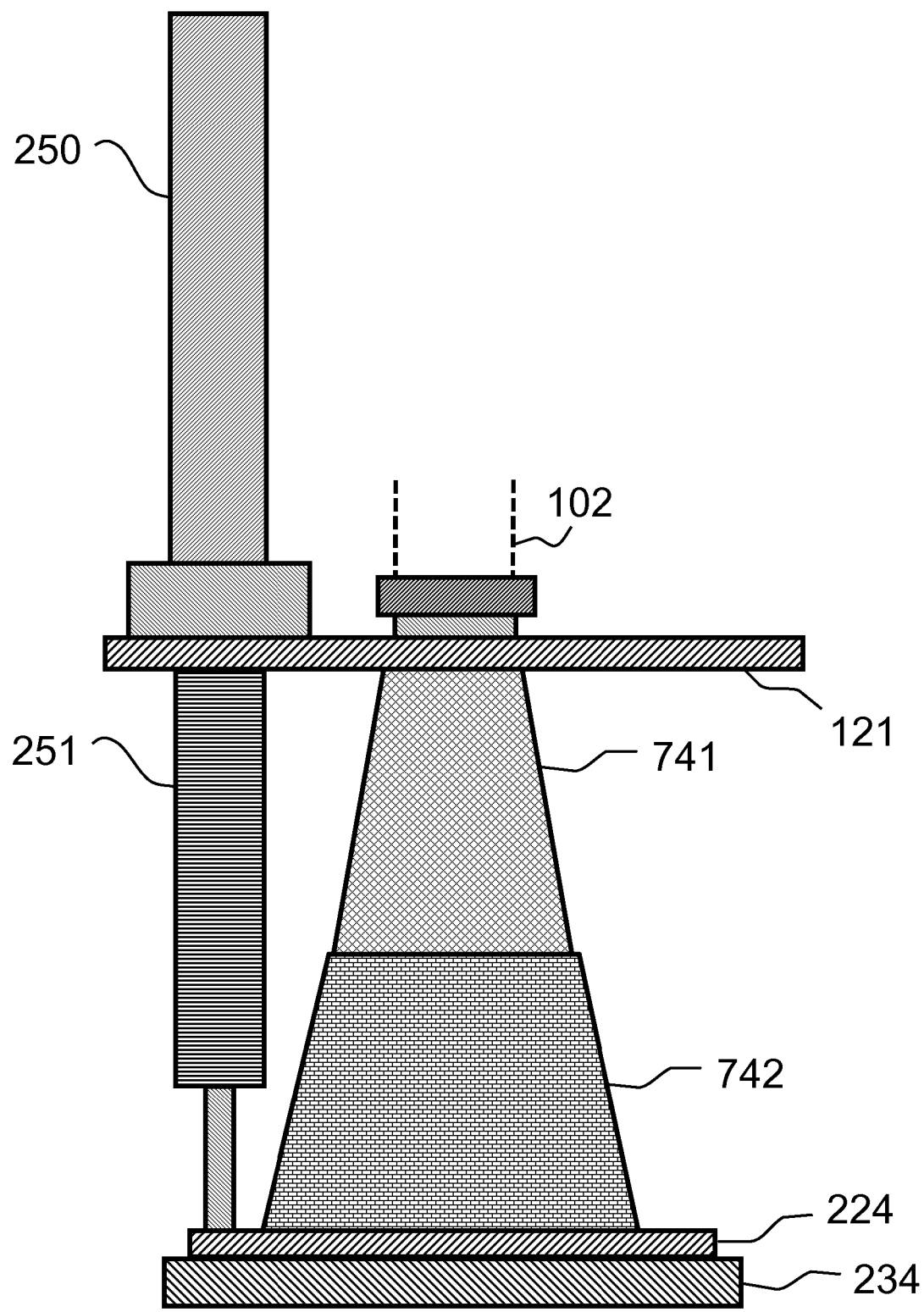
FIG. 7 shows another example embodiment having an expansion space widening towards a reaction chamber.

FIG. 7 shows another example embodiment having an expansion space widening towards a reaction chamber. The example embodiment shown in FIG. 7 is otherwise constructed and operates similarly as the example embodiments shown in FIGS. 2-6 except that herein the in-feed part only comprises two nested sub-parts 741 and 742. The lowermost sub-part 742 is connected to the uppermost sub-part 741 so that the lowermost sub-part 742 fits around the uppermost sub-part 741. At least the lowermost sub-part 742 may be of the form of a truncated cone. The uppermost sub-part 741 may preferably be of the form of a truncated cone or, for example, a cylinder.

Figure 8:
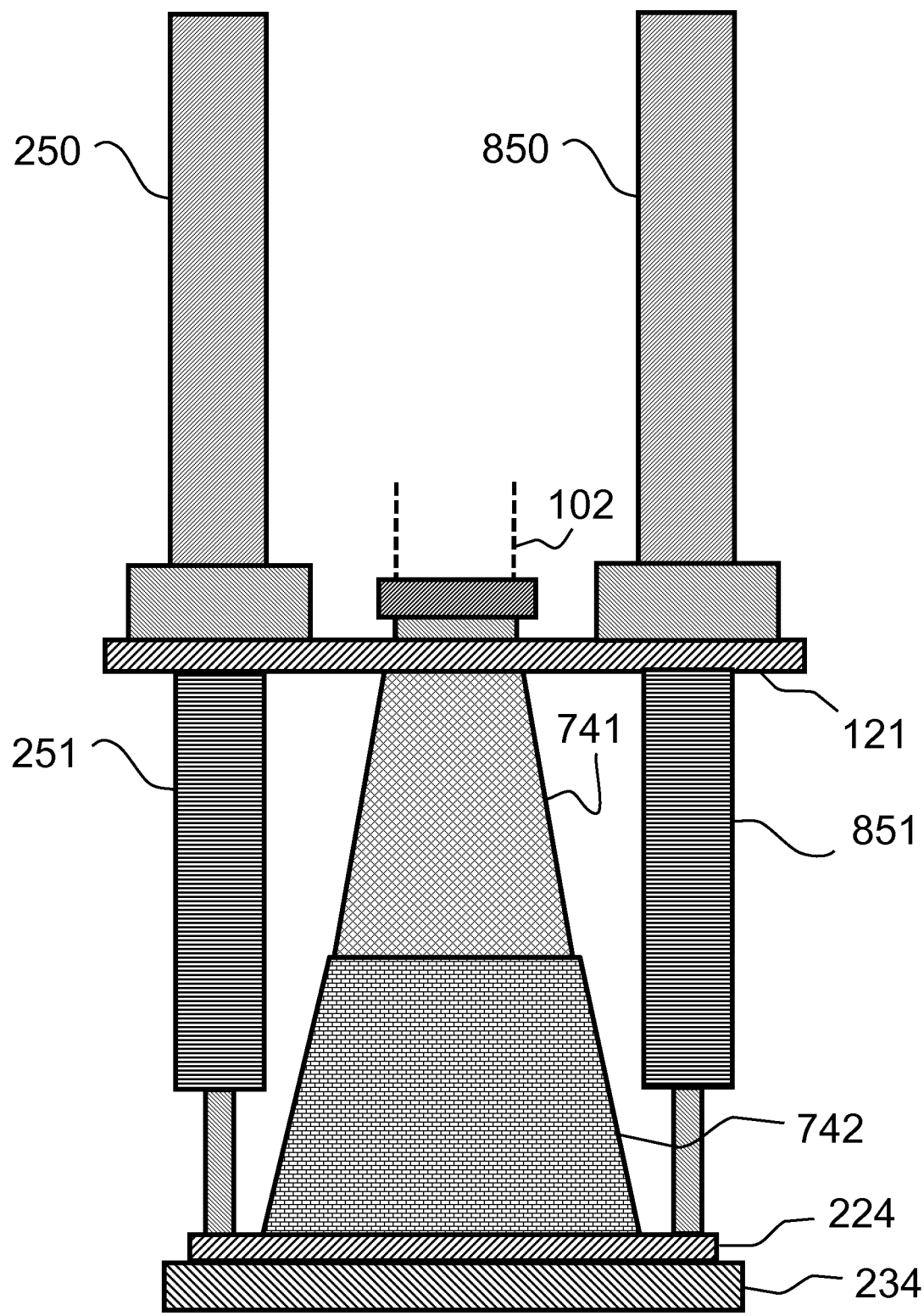
FIG. 8 shows an example embodiment with symmetrically placed elevators.

FIG. 8 shows an example embodiment with symmetrically placed elevators. In addition to the elevator 250 shown in FIGS. 2-4 and 7, the lifting mechanism in FIG. 8 comprises another elevator 850 on the opposite side of the in-feed part. The example embodiment shown in FIG. 8 is otherwise constructed and operates similarly as the example embodiments shown in FIGS. 2-4 and 7. The elevator 850 may be for example an elevator which operates by means of a pneumatic actuator or a linear actuator with a stepper motor and a lead screw and a linear feedthrough 851 or similar. In yet further embodiments, the number of symmetrically placed elevators is three or more.

Figure 9:
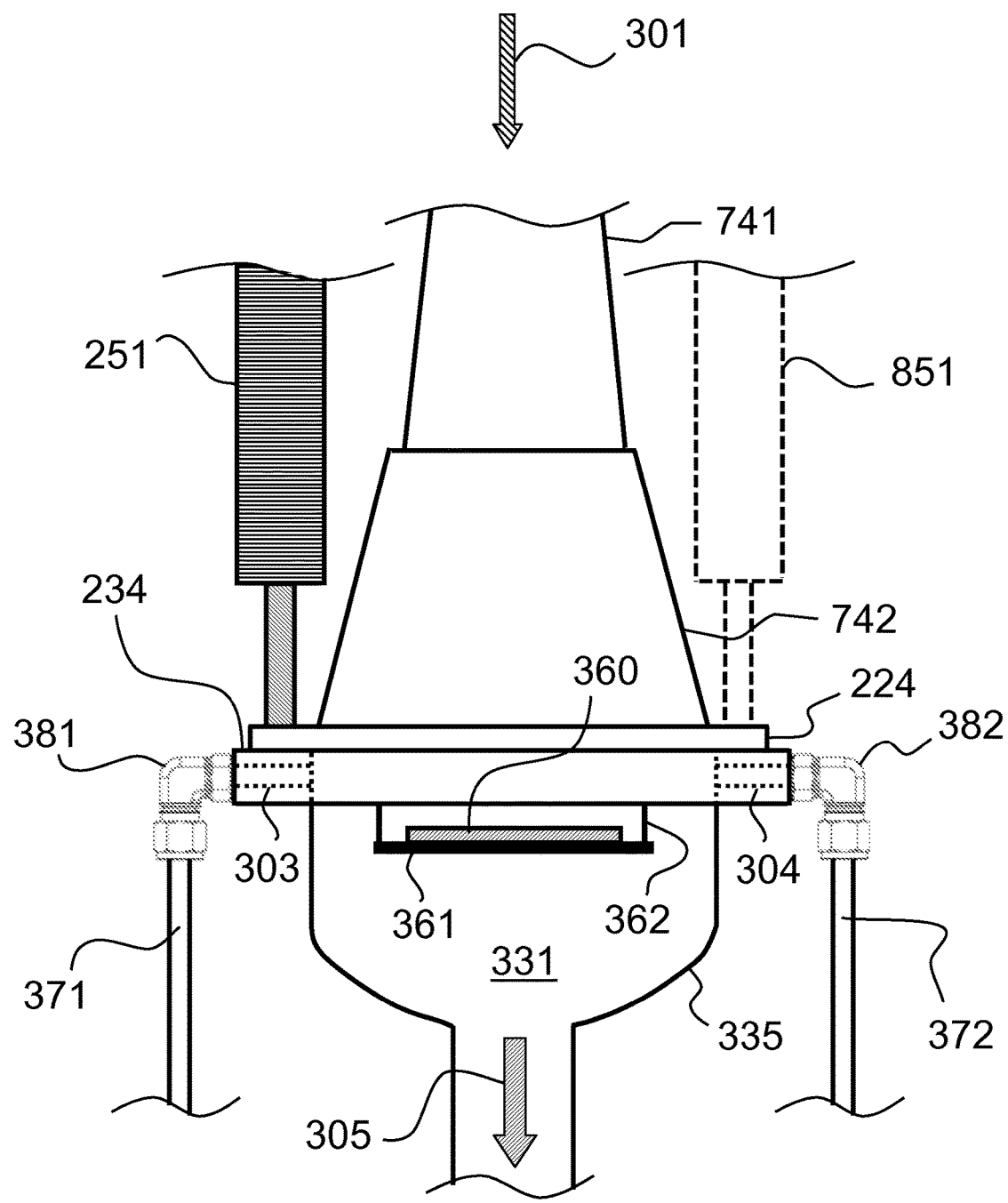
FIG. 9 shows another example embodiment based on the example embodiment shown in FIG. 3.
Figure 10:
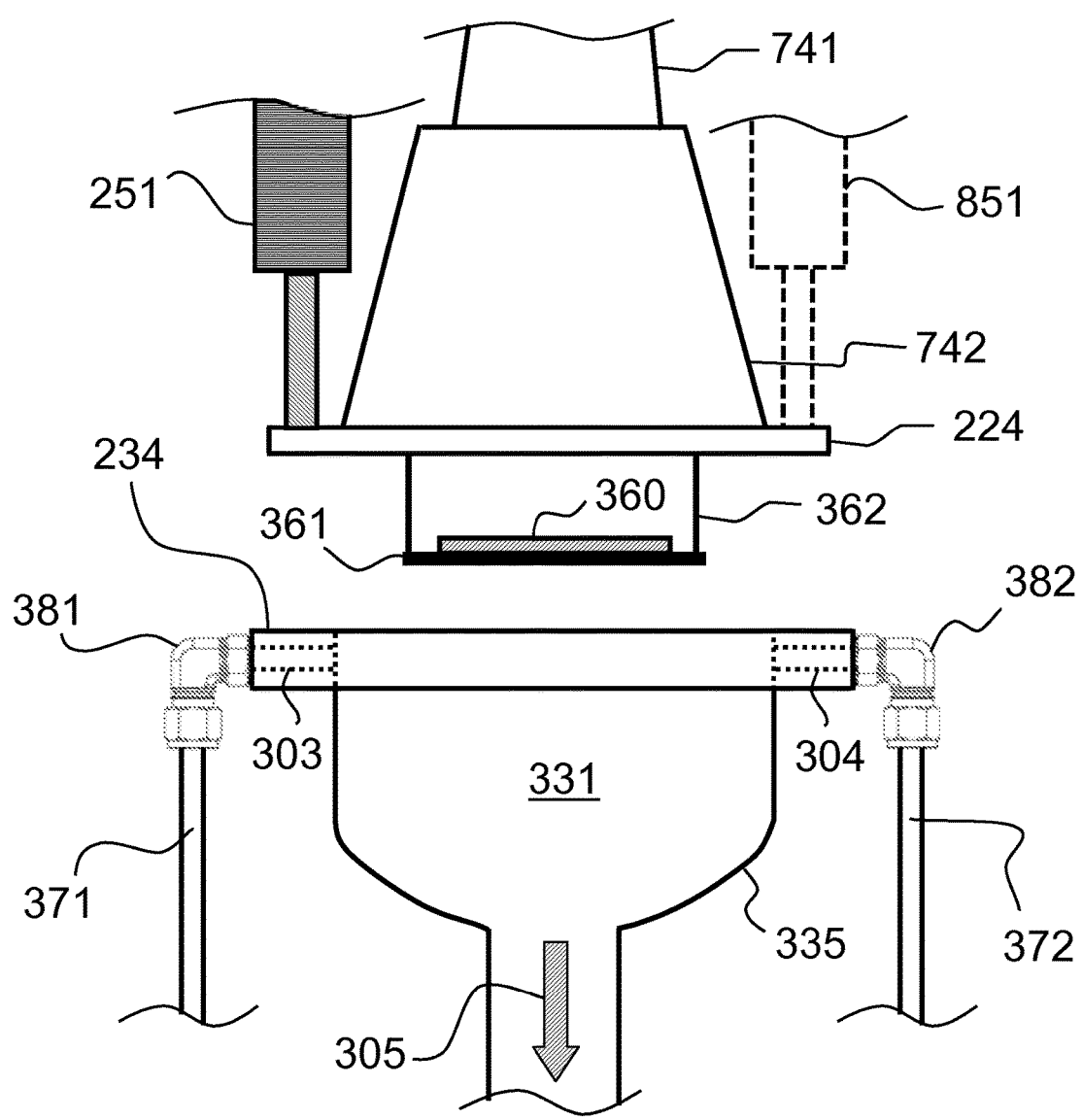
FIG. 10 shows the substrate in the embodiment of FIG. 9 in a raised position.

FIGS. 9 and 10 show example embodiments based on the example embodiments shown in FIGS. 3 and 4 complemented by features from the example embodiments shown in FIGS. 7 and/or 8. The example embodiments shown in FIGS. 9 and 10 are therefore otherwise constructed and operate similarly as the example embodiments shown in FIGS. 3 and 4 except that herein the in-feed part only comprises two nested sub-parts 741 and 742. Optionally, the lifting mechanism also comprises two or more symmetrically placed elevators.

In FIG. 9, the in-feed part, which defines the expansion space, is in its extended shape (the substrate holder 361 and the at least one substrate 360 are on a lowered position for deposition). In an embodiment, the upper sub-part 741 has an external rim (for example 3-10 mm wide) extending outwards from the bottom edge of the said upper sub-part 741 and the lower sub-part 742 has an internal rim (for example 3-10 mm wide) extending inwards from the top edge of the said lower sub-part 742. When the in-feed part is in its extended shape, the internal rim is resting on the external rim forming substantially a leak-tight surface-against-surface seal between the expansion space within the in-feed part and the intermediate space surrounding the in-feed part. In FIG. 10, the in-feed part has been deformed by the lifting mechanism into its contracted shape (the substrate holder 361 and the at least one substrate 360 are on a raised position for loading or unloading). In an embodiment, when the in-feed part is in its contracted shape, there is a large open horizontal gap between the internal rim and the external rim. The gap vanishes when the in-feed part is deformed to its extended shape and the internal rim is carefully pressed against the external rim. Formation of particles is avoided because the surfaces of the in-feed sub-parts do not rub against each other when the in-feed part is deformed from its extended shape to its contracted state and back to its extended shape.

Figure 11:
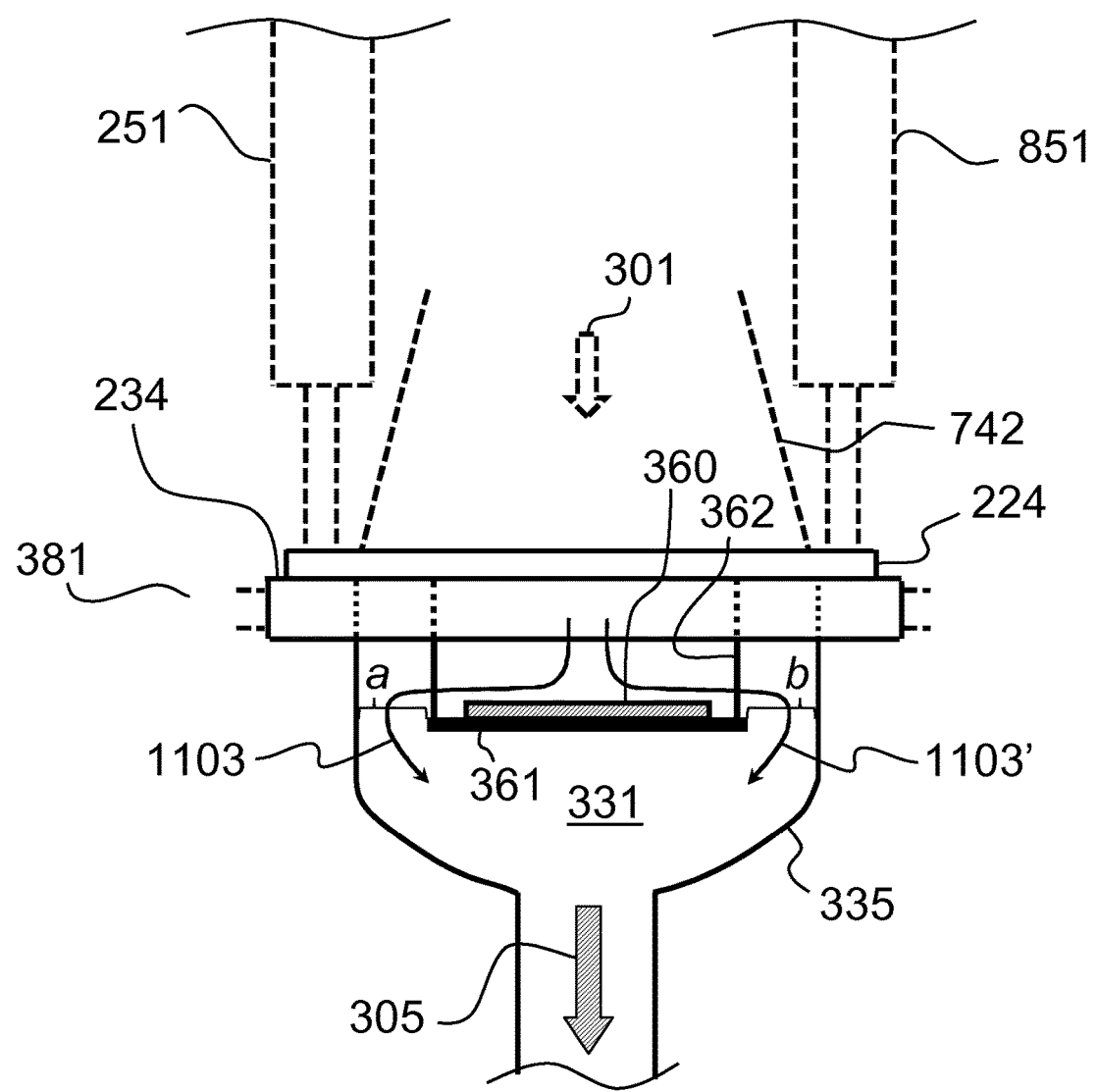
FIG. 11 shows the principle of using a substrate holder as a primary flow obstacle in accordance with an example embodiment.

FIG. 11 shows the principle of using a substrate holder as a flow obstacle in accordance with an example embodiment. In this embodiment, the substrate holder 361 is so large compared to the whole width of the reaction chamber 335 that it forms the main or primary obstacle for the gas flow in the reaction chamber 335. In an example embodiment, the substrate holder attachment(s) in the expansion space flange 224 or similar are placed so that the substrate holder 361 is laterally as close to the centre of the reaction chamber as possible. In that way the distances from the substrate holder 361 to the wall of the reaction chamber 335 on opposite sides (distances a and b) are the same. When the gas flows 1103 and 1103' towards the exhaust guide, the flow direction within the exhaust guide being indicated with the arrow 305 on the opposite sides of the substrate holder 361 are close to the same, there exist conditions for a more uniform material growth on the substrate 360, because a pressure step is formed between the gas space below the substrate holder and the gas space above the substrate holder, which helps to guide all the gaseous species efficiently in lateral direction from the central area of the substrate over the outer edge of the substrate 360 and further over the outer edge of the substrate holder 361. A pressure step means that the pressure is higher above the substrate holder than below the substrate holder.

Figure 12:
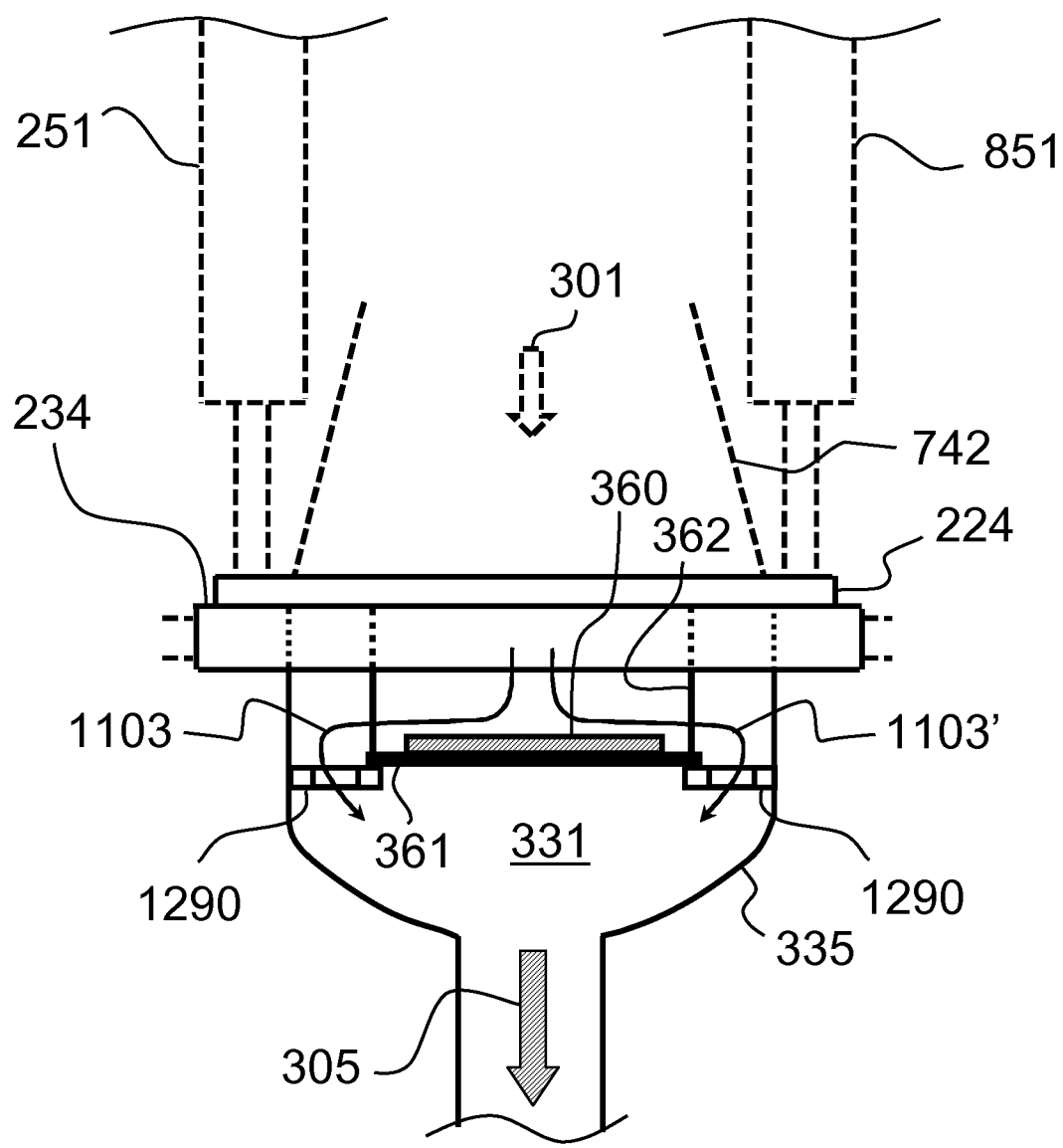
FIG. 12 shows an example embodiment with a flow adjustment part.

In order to compensate for a non-uniform gas flow, or in order to otherwise adjust the gas flow so that material growth on said at least one substrate is as uniform as possible, a flow adjustment part such as the part 1290 shown in FIG. 12 can be used in the reaction chamber 335. In the example embodiment shown in FIG. 12, the flow adjustment part 1290 is placed between the substrate holder 361 and the wall of the reaction chamber 335. In an example embodiment, it is a ring-like member. In an example embodiment, it surrounds the substrate holder 361. In an example embodiment, the flow adjustment part 1290 operates as a support for the substrate holder 361. In an example embodiment, it substantially fills in the space between the substrate holder 361 and the reaction chamber wall. The flow adjustment part 1290 is preferably perforated or at least partially slotted horizontally or vertically to facilitate controlled flow of gases through or by the said flow adjustment part.

Figure 13:
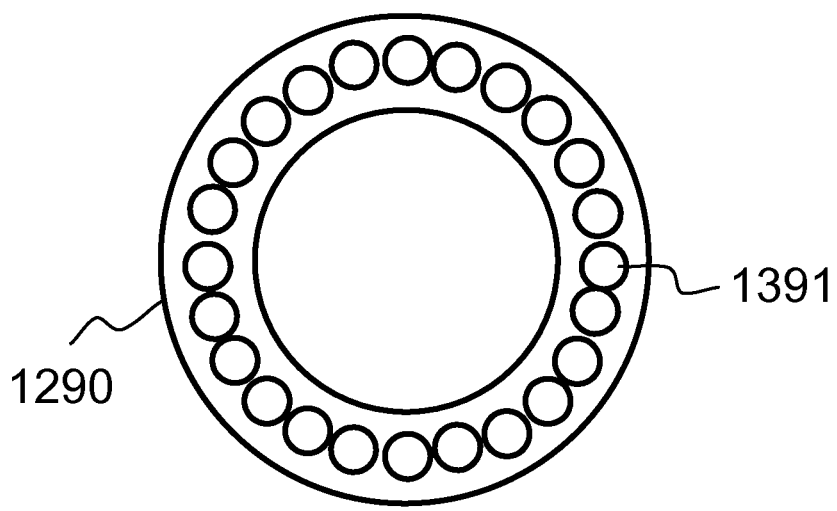
FIG. 13 shows an example implementation of the flow adjustment part of FIG. 12.
Figure 14:
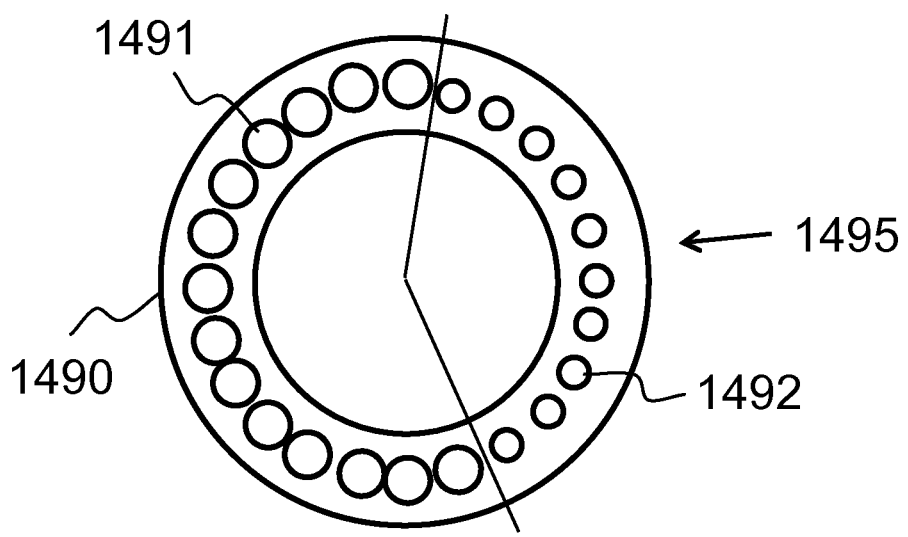
FIG. 14 shows another example implementation of the flow adjustment part of FIG. 12.

FIGS. 13 and 14 show the flow adjustment part 1290 comprising holes (or channels) in it. The flow adjustment operation in such an embodiment is based on the fact that a larger hole is capable of passing more flow (higher gas flow conductivity) than a smaller hole (smaller gas flow conductivity). Depending on the requirements, the holes may be uniform in size, such as the holes 1391 in FIG. 13, or they may be variable in size, such as shown in FIG. 14. In the embodiment shown in FIG. 14, the holes 1492 in a certain sector 1495 are smaller compared to the other holes 1491 resulting in a flow restriction in the area of the smaller holes. In an embodiment, the flow adjustment part has a variable density of holes, so that areas with higher density of holes have higher gas flow conductivity than areas with smaller density of holes.

Figure 15:
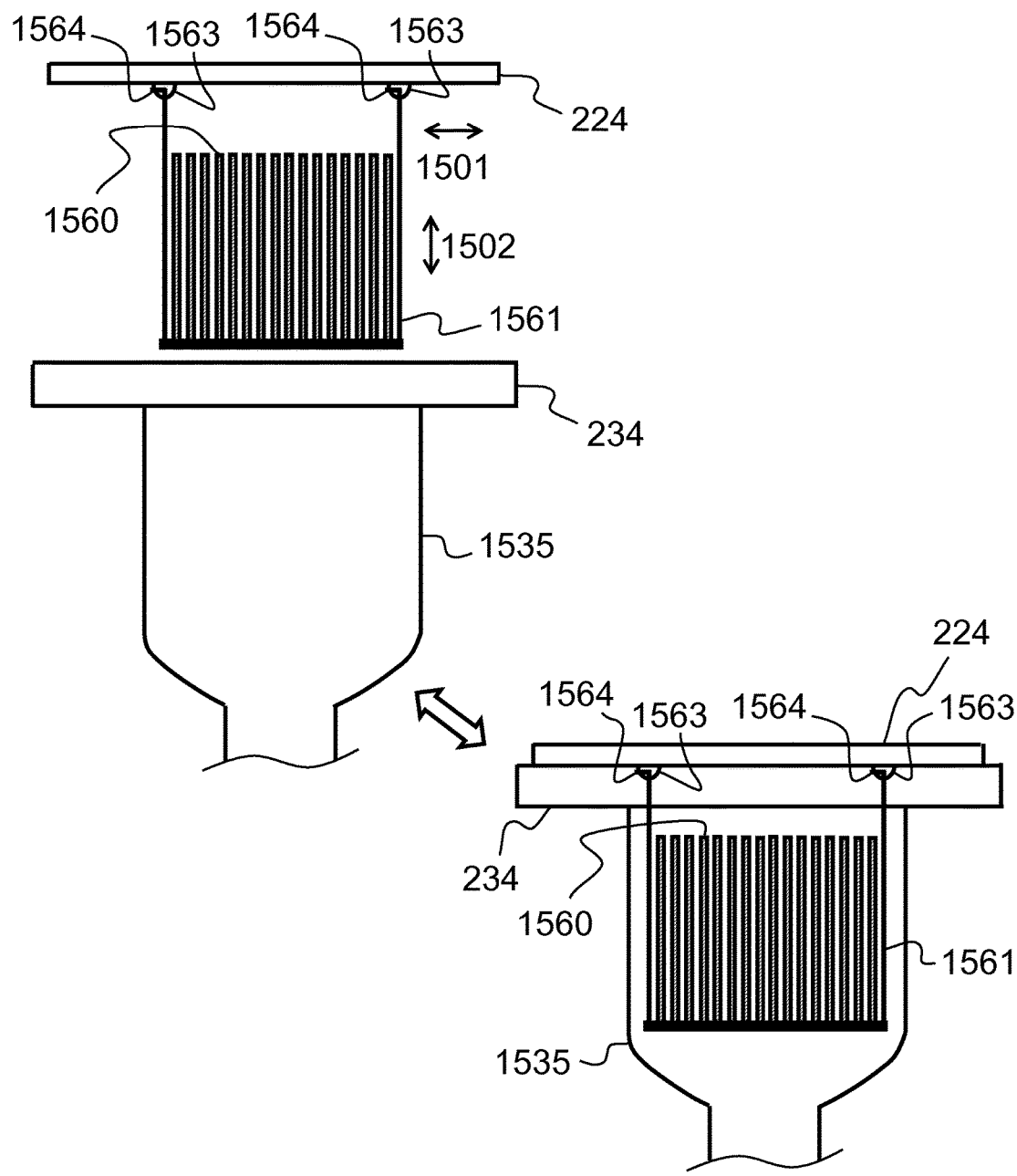
FIG. 15 shows processing a batch of substrates within the deposition reactor in accordance with an example embodiment.

FIG. 15 shows processing a batch of substrates within the deposition reactor in accordance with an example embodiment. The deposition reactor is loadable and unloadable from the top side of the reaction chamber 1535.

When the expansion space flange 224 is on its upper position, the reaction chamber 1535 is loadable or unloadable with a substrate holder 1561 carrying a batch of vertically placed substrates 1560. The substrate holder 1561 carrying the substrates 1560 can be moved in a lateral direction 1501 into attachments 1563 in the expansion space flange 224 or similar for loading and from the attachments 1563 for unloading. The substrate holder 1561 comprises gripping members 1564 such as hooks or similar that fit into the attachments 1563. The expansion space flange 224 together with the substrate holder 1561 carrying the substrates 1560 can be moved in a vertical direction 1502 with the aid of the lifting mechanism (not shown in FIG. 15). It can be lowered into the reaction chamber 1535 for deposition, and subsequently after processing, raised out from the reaction chamber 1535 for unloading. During the deposition process the expansion space flange 224 seals the reaction space from the intermediate space surrounding the reaction chamber 1535.

Alternatively, the batch of substrates 1560 in the substrate holder 1561 can be moved into the reaction chamber 1535 and from the reaction chamber 1535 without it being attached to the expansion space flange 224, for example, with a suitable robot that extends a substrate holder manipulator (not shown) over the reaction chamber for replacing the substrate holder with a new one.

The loading and unloading methods and attachments described in connection with FIG. 15 are also applicable to the other embodiments presented in this description.

Figure 16:
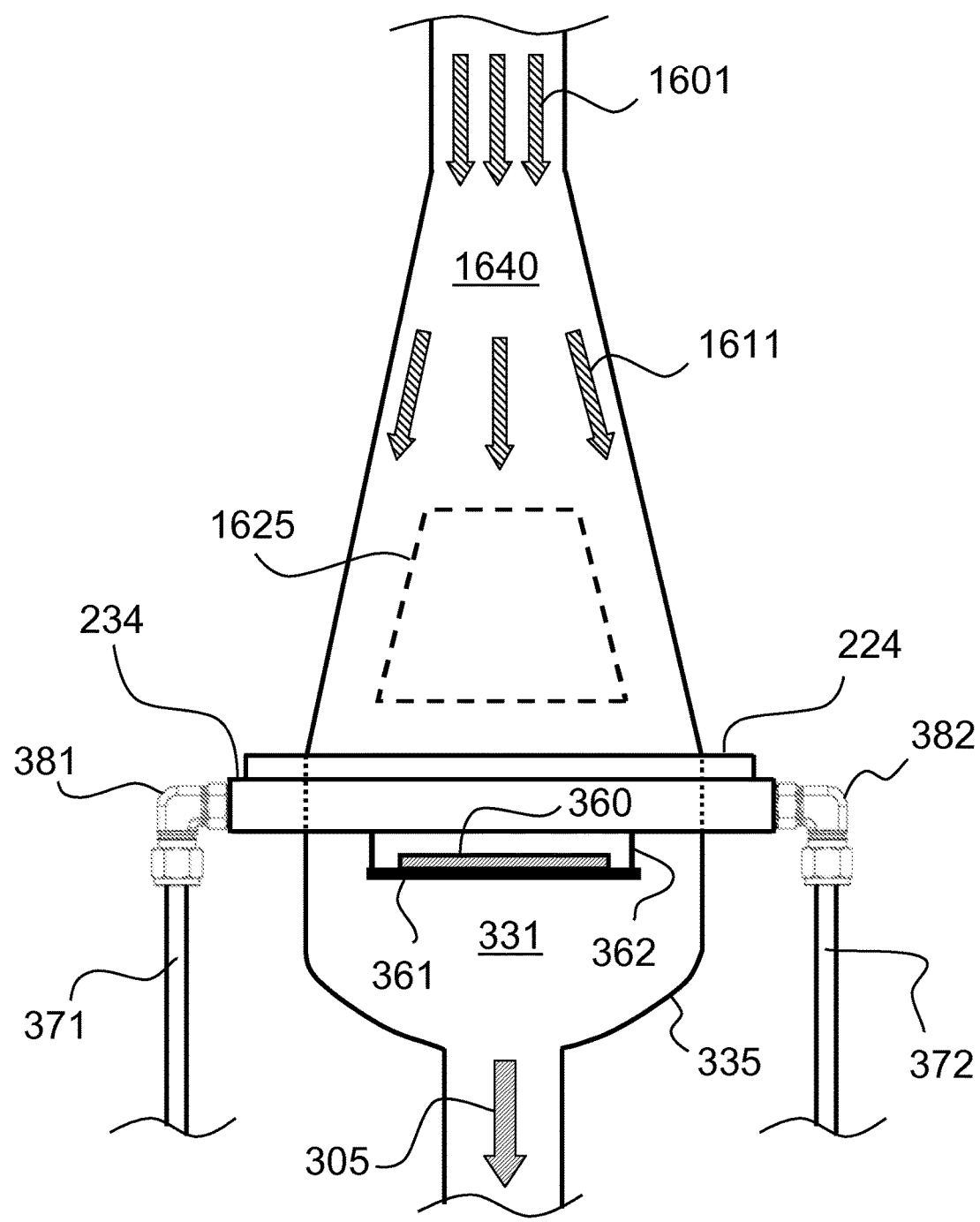
FIG. 16 shows an alternative embodiment having a manual access hatch.

FIG. 16 shows an alternative embodiment with a manual access hatch. Similarly as in the preceding example embodiments, radical flow 1601 in the example embodiment shown in FIG. 16 is expanded in an expansion space 1640 into an expanded radical flow 1611. As in preceding embodiments, the gas space between the plasma generator and the substrate holder substantially consists of an open gas space so that the majority of radicals generated by the plasma generator is capable of arriving essentially intact to the substrate without hitting any surfaces before the substrate. Any contact with surfaces would decrease the concentration of radicals. However, unlike presented in certain preceding embodiments, in this example embodiment, the part defining the expansion space 1640 (FIG. 16) does not need to be variable in its dimensions, but the at least one substrate can be loaded and unloaded via a manual access hatch 1625 arranged at a side of the part that defines the expansion space. The manual access hatch 1625 can be conveniently operated for example via the hatch 123 show in FIG. 1.

Figure 17:
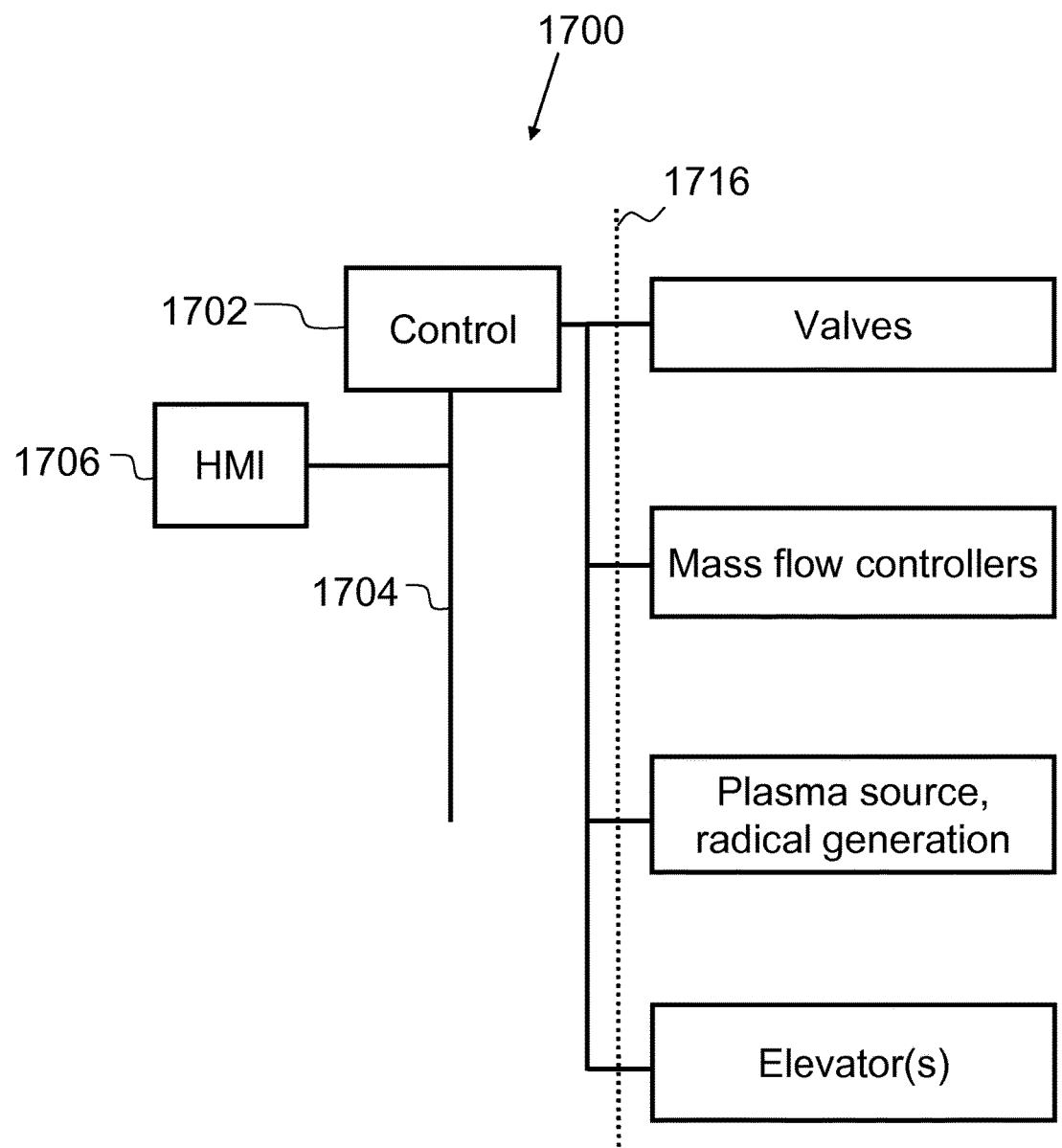
FIG. 17 shows a rough block diagram of a deposition reactor control system in accordance with an example embodiment.

In an example embodiment, the deposition reactor described herein is a computer-controlled system. A computer program stored into a memory of the system comprises instructions, which upon execution by at least one processor of the system cause the deposition reactor to operate as instructed. The instructions may be in the form of computer-readable program code. FIG. 17 shows a rough block diagram of a deposition reactor control system 1700. In a basic system setup process parameters are programmed with the aid of software and instructions are executed with a human machine interface (HMI) terminal 1706 and downloaded via Ethernet bus 1704 or similar to a control box 1702. In an embodiment, the control box 1702 comprises a general purpose programmable logic control (PLC) unit. The control box 1702 comprises at least one microprocessor for executing control box software comprising program code stored in a memory, dynamic and static memories, I/O modules, ND and D/A converters and power relays. The control box 1702 sends electrical power to pneumatic controllers of appropriate valves of the deposition reactor, and has two-way communication with appropriate mass flow controllers, and controls the operation of the plasma source and radical generation and the elevator(s), as well as otherwise controls the operation of the deposition reactor. The controlling of the operation of the elevator(s) comprises controlling the elevator(s) to move a substrate holder carrying the at least one substrate between an upper position for loading or unloading and a lower position for deposition. The control box 1702 may measure and relay probe readings from the deposition reactor to the HMI terminal 1706. A dotted line 1716 indicates an interface line between the deposition reactor parts and the control box 1702.

The following experimental examples further demonstrate the operation of selected example embodiments.

Example 1

In this example, an ALD reactor was equipped with an automated wafer loading system, and a remote plasma generator. The wafer loading system was attached with a gate valve to the load lock flange 122 (FIG. 1). In this experiment the deposition reactor was operated without the closing member 115, and the plasma generator was attached on top of the transfer chamber upper flange 121. The in-feed lines 371, 372 of the ALD reactor for the non-radical precursors were purged with nitrogen gas. The flow rate of nitrogen was typically in the range of 50-150 sccm in each said in-feed line. Small nitrogen flow rate (50 sccm) was preferably used in in-feed lines to keep the pressure of the reaction chamber 331 suitable for processing with radicals.

The radical source line between the remote plasma generator and the ALD reaction chamber was purged with argon gas. The flow rate of argon was typically in the range of 10-100 sccm. Small argon flow rate (20 sccm) was preferably used to switch on the plasma reliably.

The ALD reaction chamber was heated to 200° C. while keeping the reactor in vacuum with a vacuum pump. The pressure of the reaction chamber was preferably in the range of 0.2-1.0 hPa during the generation of radicals with the plasma source. The expansion space flange 224 was lifted up together with the nested expansion space sub-parts 241, 242 with the elevator 250 to the wafer handling position. The gate valve was opened and a wafer fork having a 100-mm silicon wafer was pushed with the automated wafer loading system through the open gap between the expansion space flange 224 and the reaction chamber flange 234 to the space above the substrate holder 361 sections. Then the wafer fork was lowered until the substrate was resting on the substrate holder 361 sections. The substrate holder 361 had a sufficiently wide open gap between the left and right sections of the substrate holder so that the wafer fork could be moved freely up and down between the sides of the substrate holder while the sections of the substrate holder could firmly support the wafer picked up from the wafer fork. After that the empty wafer fork was pulled horizontally away from the space below the substrate holder 361 sections to the load lock space (not shown).

The intermediate space of the reactor surrounding the reaction chamber was sealed from the load lock space with a gate valve (not shown) attached to the load lock flange 122. The expansion space flange 224 with the substrate holder 361 was lowered with pneumatic lifting system to the deposition position on the reaction chamber, sealing the reaction chamber space from the intermediate space.

The deposition process was started by pulsing trimethylaluminum (TMA) vapor through the in-feed 371 and to the reaction chamber for 0.1 s. TMA molecules chemisorbed on the substrate surface and formed a molecular layer of aluminum precursor species on the surface. After that the reaction chamber was purged with nitrogen arriving from the non-radical precursor in-feed lines 371, 372 and argon gas arriving from the plasma generator for 8 s to remove surplus TMA molecules and reaction byproducts (such as methane $CH_4$ molecules) originated from the surface reactions.

Argon gas flowed continuously through the remote plasma generator to the ALD reaction chamber to block reactive gases from back-streaming towards the remote plasma generator. The mass flow rate of argon was 20 sccm. The pulsing valve of the oxygen gas line before the remote plasma generator was opened to inject oxygen gas into the flowing argon gas. The mass flow rate of oxygen gas was 50 sccm. Because the oxygen gas injection changed the pressure inside the remote plasma generator, the stabilization of the argon and oxygen gas mixture flow inside the remote plasma generator was waited for 1.5 s. This pre wait state (1.5 s in this experiment) helped to switch the plasma on reliably in every pulsing sequence during the deposition process. Next the power level of the plasma generator was increased from the RF power off level (p1=0 W) to the RF power on level (p2=2500 W) and kept at the RF power on level for 6 s for generating oxygen radicals. Then the power level was decreased back to the RF power off level (p1=0 W). After 0.5 s the pulsing valve of the oxygen gas line was closed. This optional post wait state (0.5 s in this experiment) after decreasing the RF power level was used to help switching the plasma off reliably in a controlled way in every pulsing sequence during the deposition process.

To complete the basic pulsing sequence, the system was purged the same way as after the TMA pulse to remove residual precursor molecules and reaction byproducts from the reaction chamber. The pulsing sequence consisting of TMA pulse/purge/radical pulse/purge was repeated 500 times.

After the deposition process the expansion space flange 224 was lifted up together with the nested expansion space sub-parts 241, 242 with the elevator 250 to the wafer handling position. The gate valve was opened and an empty wafer fork was pushed with the automated wafer loading system through the open gap between the expansion space flange 224 and the reaction chamber flange 234 to the space below the substrate holder 361 sections. Then the wafer fork was lifted until the substrate was resting on the wafer fork. After that the wafer fork with the wafer was pulled horizontally away from the space above the substrate holder 361 sections to the load lock space (not shown).

As a result, the 100-mm wafer had a high-quality $Al_2O_3$ thin film with smaller than 2% 1-sigma thickness non-uniformity measured from 49 points on the wafer.

Example 2

A deposition experiment was made at 200° C. with TMA and molecular oxygen ($O_2$) in thermal ALD mode for a comparison. It was noticed that $O_2$ was too inert to react with TMA molecules and a thin film did not grow. Thus, oxygen radicals (O*) were required for the thin film growth.

The foregoing description has provided by way of non-limiting examples of particular implementations and embodiments of the invention a full and informative description of the best mode presently contemplated by the inventors for carrying out the invention. It is however clear to a person skilled in the art that the invention is not restricted to details of the embodiments presented above, but that it can be implemented in other embodiments using equivalent means without deviating from the characteristics of the invention.

Furthermore, some of the features of the above-disclosed embodiments of this invention may be used to advantage without the corresponding use of other features. As such, the foregoing description should be considered as merely illustrative of the principles of the present invention, and not in limitation thereof. Hence, the scope of the invention is only restricted by the appended patent claims.

The invention claimed is:
1. A method of operating a deposition reactor comprising:
   providing a deposition reactor comprising:
      a reaction chamber;
      a remote plasma generator;
      a substrate transfer chamber in between the remote plasma generator and the reaction chamber providing an intermediate space surrounding the reaction chamber;
      a vertically deformable part defining a reaction space to lead reactants as a top to bottom flow, the vertically deformable part having a contracted shape and an extended shape;
      an elevator coupled to the vertically deformable part;
      a vacuum pump to provide vacuum for the reaction chamber and intermediate space; and
      a controller,
   the method further comprising:
      controlling the elevator with the controller to move the vertically deformable part to its contracted shape to effect a loading opening for substrate(s); and
      controlling the elevator with the controller to move the vertically deformable part to its extended shape to move the substrate(s) into the reaction chamber and to seal the reaction chamber from the intermediate space for processing substrate(s).
2. The method of claim 1, comprising: pushing or pulling said vertically deformable part by the elevator from the extended shape to the contracted shape allowing said loading of substrate(s) when said vertically deformable part is in its contracted shape.

3. A deposition reactor comprising:
a reaction chamber;
a remote plasma generator;
a substrate transfer chamber in between the remote plasma generator and the reaction chamber providing an intermediate space surrounding the reaction chamber;
a vertically deformable part defining a reaction space to lead reactants as a top to bottom flow, the vertically deformable part having a contracted shape and an extended shape;
an elevator coupled to the vertically deformable part; a controller configured to:
control the elevator to move the vertically deformable part to its contracted shape to effect a loading opening for substrate(s); and
control the elevator to move the vertically deformable part to its extended shape to move the substrate(s) into the reaction chamber and to seal the reaction chamber from the intermediate space for processing substrate(s); and
a vacuum pump to provide vacuum for the reaction chamber and intermediate space.

4. The deposition reactor of claim 3, wherein said elevator is configured to push or pull said vertically deformable part from the extended shape to the contracted shape allowing said loading of substrate(s) when said vertically deformable part is in its contracted shape.

5. The deposition reactor of claim 3, wherein said vertically deformable part comprises a set of nested sub-parts or ring-like members movable to fit within each other.

6. The deposition reactor of claim 3, wherein said vertically deformable part consists of two nested sub-parts.

7. The deposition reactor of claim 3, wherein said vertically deformable part is an in-feed part attached to an expansion space flange which in turn is fitted against a top flange of the reaction chamber during deposition.

8. The deposition reactor of claim 3, wherein said elevator is configured to move a substrate holder carrying said substrate(s) between an upper position for loading or unloading and a lower position for deposition.

9. The deposition reactor of claim 3, wherein said substrate transfer chamber comprises an interface for a load lock.

10. The deposition reactor of claim 3, wherein said vertically deformable part is an in-feed part comprising a manual access hatch.

11. The deposition reactor of claim 3, comprising a plurality of symmetrically placed elevators.

12. The deposition reactor of claim 3, wherein the deposition reactor is configured to use a substrate holder carrying said substrate(s) as a primary obstacle for the gas flow in the reaction space.

13. The deposition reactor of claim 3, comprising a flow adjustment part between a substrate holder and reaction chamber wall.

14. The deposition reactor of claim 3, the deposition reactor comprising
a substrate holder coupled to the vertically deformable part; and
the vertically deformable part in its contracted shape lifting the substrate holder into an upper position for loading or unloading; and
the vertically deformable part in its extended shape lowering the substrate holder into the reaction chamber.

15. The deposition reactor of claim 3, the vertically deformable part in its extended shape closing the loading opening.

* * * * *